(12) United States Patent
Chen et al.

(10) Patent No.: US 7,452,778 B2
(45) Date of Patent: Nov. 18, 2008

(54) SEMICONDUCTOR NANO-WIRE DEVICES AND METHODS OF FABRICATION

(75) Inventors: Hung-Wei Chen, Hsinchu (TW); Yee-Chia Yeo, Singapore (SG); Di-Hong Lee, Austin, TX (US); Fu-Liang Yang, Hsin-Chu (TW); Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 216 days.

(21) Appl. No.: 11/104,348

(22) Filed: Apr. 12, 2005

(65) Prior Publication Data
US 2005/0275010 A1    Dec. 15, 2005

Related U.S. Application Data

(60) Provisional application No. 60/578,673, filed on Jun. 10, 2004.

(51) Int. Cl.
*H01L 21/336* (2006.01)
(52) U.S. Cl. .................. 438/283; 438/284
(58) Field of Classification Search .......... 438/283, 438/284
See application file for complete search history.

(56) References Cited

U.S. PATENT DOCUMENTS

| | | | |
|---|---|---|---|
| 4,933,298 A | 6/1990 | Hasegawa | |
| 4,946,799 A | 8/1990 | Blake et al. | |
| 5,115,289 A | 5/1992 | Hisamoto et al. | |
| 5,317,175 A | 5/1994 | Throngnumchai | |
| 5,317,178 A | 5/1994 | Wu | |
| 5,464,783 A | 11/1995 | Kim et al. | |
| 5,607,865 A | 3/1997 | Choi et al. | |
| 5,801,397 A * | 9/1998 | Cunningham | 257/66 |
| 5,814,895 A | 9/1998 | Hirayama | |
| 5,998,852 A | 12/1999 | Berry et al. | |
| 6,114,725 A | 9/2000 | Furukawa et al. | |
| 6,157,061 A | 12/2000 | Kawata | |
| 6,222,234 B1 | 4/2001 | Imai | |
| 6,252,284 B1 | 6/2001 | Muller et al. | |
| 6,300,182 B1 | 10/2001 | Yu | |
| 6,342,410 B1 | 1/2002 | Yu | |
| 6,344,392 B1 | 2/2002 | Liaw | |
| 6,380,024 B1 | 4/2002 | Liaw | |
| 6,387,739 B1 | 5/2002 | Smith, III | |

(Continued)

OTHER PUBLICATIONS

Geppert L., "The Amazing Vanishing Transistor Act," IEEE Spectrum, Oct. 2002, pp. 28-33.

(Continued)

*Primary Examiner*—Jack Chen
*Assistant Examiner*—Matthew Reames
(74) *Attorney, Agent, or Firm*—Slater & Matsil, L.L.P.

(57) ABSTRACT

Nano-wires, preferably of less than 20 nm diameter, can be formed with minimized risk of narrowing and breaking that results from silicon atom migration during an annealing process step. This is accomplished by masking portion of the active layer where silicon atomer would otherwise agglomerate with a material such as silicon dioxide, silicon nitride, or other dielectric that eliminates or substantially reduces the silicon atom migration. Nano-wires, nanotubes, nano-rods, and other features can be formed and can optionally be incorporated into devices, such as by use as a channel region in a transistor device.

21 Claims, 20 Drawing Sheets

U.S. PATENT DOCUMENTS

| | | |
|---|---|---|
| 6,391,695 B1 | 5/2002 | Yu |
| 6,391,782 B1 | 5/2002 | Yu |
| 6,391,796 B1 | 5/2002 | Akiyama et al. |
| 6,411,725 B1 | 6/2002 | Rhoads |
| 6,413,802 B1 | 7/2002 | Hu et al. |
| 6,432,829 B2 | 8/2002 | Muller et al. |
| 6,451,656 B1 | 9/2002 | Yu et al. |
| 6,475,869 B1 | 11/2002 | Yu |
| 6,475,890 B1 | 11/2002 | Yu |
| 6,476,437 B2 | 11/2002 | Liaw |
| 6,492,212 B1 | 12/2002 | Leong et al. |
| 6,514,808 B1 | 2/2003 | Samavedam et al. |
| 6,521,949 B2 | 2/2003 | Assaderaghi et al. |
| 6,525,403 B2 | 2/2003 | Inaba et al. |
| 6,534,807 B2 | 3/2003 | Mandelman et al. |
| 6,562,491 B1 | 5/2003 | Jeon |
| 6,573,549 B1 | 6/2003 | Deng et al. |
| 6,596,599 B1 | 7/2003 | Guo |
| 6,605,514 B1 | 8/2003 | Tabery et al. |
| 6,610,576 B2 | 8/2003 | Nowak |
| 6,611,029 B1 | 8/2003 | Ahmed et al. |
| 6,617,210 B1 | 9/2003 | Chau et al. |
| 6,635,909 B2 | 10/2003 | Clark et al. |
| 6,642,090 B1 | 11/2003 | Fried et al. |
| 6,657,252 B2 | 12/2003 | Fried et al. |
| 6,686,231 B1 | 2/2004 | Ahmed et al. |
| 6,706,571 B1 | 3/2004 | Yu et al. |
| 6,720,231 B2 | 4/2004 | Fried et al. |
| 6,720,619 B1 | 4/2004 | Chen et al. |
| 6,762,448 B1 | 7/2004 | Lin et al. |
| 6,768,158 B2 | 7/2004 | Lee et al. |
| 6,844,238 B2 | 1/2005 | Yeo et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,519 B2 | 3/2005 | Yeo et al. |
| 6,992,354 B2 | 1/2006 | Nowak et al. |
| 7,005,330 B2 | 2/2006 | Yeo et al. |
| 7,074,656 B2 | 7/2006 | Yeo et al. |
| 7,105,894 B2 | 9/2006 | Yeo et al. |
| 7,214,991 B2 | 5/2007 | Yeo et al. |
| 7,276,763 B2 | 10/2007 | Yeo et al. |
| 2002/0011612 A1 | 1/2002 | Hieda |
| 2003/0011080 A1 | 1/2003 | Deshpande et al. |
| 2003/0042528 A1 | 3/2003 | Forbes |
| 2003/0042531 A1 | 3/2003 | Lee et al. |
| 2003/0057486 A1 | 3/2003 | Gambino et al. |
| 2003/0067017 A1 | 4/2003 | Leong et al. |
| 2003/0102497 A1 | 6/2003 | Fried et al. |
| 2003/0111678 A1 | 6/2003 | Colobuo et al. |
| 2003/0113970 A1 | 6/2003 | Fried et al. |
| 2003/0178670 A1 | 9/2003 | Fried et al. |
| 2003/0178677 A1 | 9/2003 | Clark et al. |
| 2004/0007715 A1 | 1/2004 | Webb et al. |
| 2004/0031979 A1 | 2/2004 | Lochtefeld et al. |
| 2004/0036126 A1 | 2/2004 | Chau et al. |
| 2004/0038464 A1 | 2/2004 | Fried et al. |
| 2004/0061178 A1 | 4/2004 | Lin et al. |
| 2004/0075122 A1 | 4/2004 | Lin et al. |
| 2004/0108523 A1 | 6/2004 | Chen et al. |
| 2004/0119100 A1 | 6/2004 | Nowak et al. |
| 2004/0145000 A1 | 7/2004 | An et al. |
| 2005/0121706 A1 | 6/2005 | Chen et al. |
| 2006/0220133 A1 | 10/2006 | Yeo et al. |
| 2006/0234431 A1 | 10/2006 | Yeo et al. |

OTHER PUBLICATIONS

Tang, et al., "FinFET-A quasi-Planar Double Gate MOSFET," IEEE International Solid State Circuits Conference, pp. 118-119 and 437.

Yang, et al., "35nm CMOS FinFETs," 2002 Symposium on VLSI Technology Digest of Technical Papers, 2002, pp. 104-105.

Nemati, et al., "A Novel Thyristor-based SRAM Cell (T-RAM) for High-Speed, Low-Voltage, Giga-scale Memories," IEEE 1999, IEDM vol. 99, pp. 283-286, Center for Integrated Systems, Stanford University, Stanford, CA.

Oh, et al., "Analytic Description of Short-Channel Effects in Fully-Depleted Double-Gate and Cylindrical, Surrounding-Gate MOSFETs,"IEEE Sep. 2000, Electron Device Letters, vol. 21, No. 9, pp. 445-447.

Kranti, et al., "Design Guidelines of Vertical Surrounding Gate (VSG) MOSFETs for Future ULSI Circuit Applications," IEEE 2001, pp. 161-165.

Fung, et al., "Gate Length Scaling to 30nm Regime Using Ultra-thin Film PD-SOI Technology", International Electron Device Meeting 2001, Technical Digest, pp. 629-632.

Chen, et al., "Suppression of the SOI Floating-body Effects by Linked-body Device Structure", 1996 Symposium on VLSI Technology, Digest of Technical Papers, pp. 92-93.

Celik, et al., "A 45 nm Gate Length High Performance SOI Transistor for 100nm CMOS Technology Applications", 2002 Symposium on VLSI Technology, Digest of Technical Papers, pp. 166-167.

Chau, et al., "A 50 nm Depleted-substrate CMOS Transistor (DST)", International Electron Device Meeting 2001, Technical Digest, pp. 621-624.

Shahidi G. G., "SOI Technology for GHz Era," IBM Journal of Research & Development, vol. 46, pp. 121-131, 2002.

Colinge, et al., "Silicon-On-Insulator Gate-All-Around Device," IEEE 1990, IEDM, vol. 90, pp. 595-598, IMEC, Kapeldreef 75, 3030 Leuvevn, Belgium.

Nitayama, et al., "Multi-Pillar Surrounding Gate Transistor (M-SGT) for Compact and High-Speed Circuits," IEEE Mar. 1991, Transactions on Electronic Devices, vol. 38, No. 3, pp. 579-583.

Yamagata, et al., "Selective Growth of Si Crystals from the Agglomerated Si Seeds over Amorphous Substrates," Appl. Phys. Lett. 61 (21), Nov. 23, 1992, pp. 2557-2559 American Institute of Physics.

Sato, et al., "Hydrogen Annealed Silicon-On-Insulator," Appl. Phys. Lett. 65 (15) Oct. 10, 1994, pp. 1924-1926, American Institute of Physics.

Auth, et al., "Scaling Theory for Cylindrical, Fully-Depleted, Surrounding-Gate MOSFET's," IEEE Feb. 1997, Electron Device Letters, vol. 18, No. 2, pp. 74-76.

Leobandung, et al., "Wire-channel and wrap-around-gate metal-oxide-semiconductor field effect transistors with a significant reduction of short channel effects," J. Vac. Sci. Technol. B 15(6) Nov./Dec. 1997, pp. 2791-2794, American Vacuum Society.

Minkyu, et al., "Quantized Conductance of a Gate-All-Around Silicon Quantum Wire Transistor," Microprocesses and Nanotechnology Conference 1998, Department of Electrical Engineering, Kaist, Taejon, 305-701, Korea, pp. 150-151.

Chau, et al., "Advanced Depleted-Substrate Transistors: Single-gate, Double-gate and Tri-gate," Extended Abstracts of the 2002 International Conference on Solid State Devices and Materials (2002), pp. 68-69.

Huang, et al., "Sub-50 nm P-Channel FinFET," IEEE Transactions on Electrons Devices, vol. 48, No. 5 (May 2001) pp. 880-886.

Wong, H.S.P., "Beyond the Conventional Transistor," IBM Journal of Research and Development, vol. 46, No. 2/3 (Mar./May 2002), pp. 133-167.

Yang, et al., "25nm CMOS Omega FETs," International Electron Devices Meeting, Digest of Technical Papers (Dec. 2002), pp. 255-258.

Solymar, L., et al., "Electrical Properties of Materials," Oxford University Press, 1998, Sixth Edition, pp. 152.

Wolf, S., "Silicon Processing for the VLSI Era, vol. 2: Process Integration," Lattice Press, Sunset Beach, California, 1990, p. 369.

* cited by examiner

Si Agglomerate    Broken Si Line

SEMICONDUCTOR NANO-WIRE DEVICES AND METHODS OF FABRICATION

This application claims priority to provisional patent application Ser. No. 60/578,673 filed on Jun. 10, 2004, entitled "Semiconductor Nanowire Devices and Methods of Fabrication," which application is hereby incorporated herein by reference.

TECHNICAL FIELD

The present invention relates generally to methods for manufacturing semiconductor devices. In particular, this invention teaches a method of forming a nano-wire structure for a channel of a field effect transistor.

BACKGROUND

Metal-oxide-semiconductor field effect transistors (MOSFETs) are used in ultra-large scale integrated (ULSI) circuits, which are found in today's semiconductor integrated circuit (IC) chip products. The gate length of the MOSFET is continuously being scaled down for faster circuit speed, higher circuit density and increased functionality, and lower cost per unit function. As the gate length of the MOSFET is scaled into the sub-20 nm regime, the source and drain increasingly interact with the channel to substantially influence the channel potential. Hence, a transistor with a short gate length often suffers from problems related to the inability of the gate to substantially control the on/off states of the channel. Phenomena related to the reduced gate control of the channel potential are called short-channel effects.

Increased body doping concentration, reduced gate oxide thickness, and junction depths are some ways to suppress short-channel effects. However, for device scaling well into the sub-20 nm regime, the requirements for body-doping concentration, gate oxide thickness, and source/drain doping profiles become increasingly difficult to meet using conventional device structures based on bulk silicon substrates. Therefore, alternative device structures that offer better control of short-channel effects are being considered to enable the continued scaling down of transistor sizes.

A highly scalable device structure that offers superior control of short-channel effects is a wrap-around gate structure for a transistor (a.k.a., surround-gate or gate-all-around transistor structure). A wrap-around gate structure typically has a gate that surrounds or wraps around a channel region. This structure effectively improves the capacitance coupling between the gate and the channel, as compared to conventional bulk silicon substrate transistor structures, double-gate transistor structures, and triple-gate transistor structures. With the wrap-around gate structure, the gate gains significant influence on the channel potential, and therefore improves suppression of short-channel effects. A wrap-around gate structure typically allows the gate length to be scaled down by about 50% more compared to a double-gate structure. An example of a wrap-around gate structure is illustrated in FIG. 1. More specifically, FIG. 1a shows a perspective view of an exemplary transistor 1 having a source 2 and drain 4 formed of a semiconductor nano-wire. Extending between the source and drain is a channel region 7 (as shown in cross sectional view FIG. 1b). A gate dielectric 10 wraps around the channel region 7 and a gate electrode 8 wraps around the gate dielectric. Electric field effects that gate electrode 8 exerts on channel region 7 are schematically illustrated by arrows 12 in FIG. 1b.

There are several different ways to implement a wrap-around gate transistor structure. For example, the transistor channel may be oriented vertically or horizontally. Many of the existing designs for horizontally oriented channels have a square or rectangular shaped cross-section. When the channel cross-section is rectangular or square, enhanced field effects at the corners of the rectangle may cause that part of the transistor to turn on earlier (i.e., having a lower threshold voltage) than parts of the transistor at the flat sides of the rectangular channel cross-section. This may result in a parasitic off-state leakage. Hence, a cylindrical channel cross-section is preferred over a rectangular channel cross-section.

Current attempts at obtaining a more circular channel cross-section are made by oxidizing the silicon beam forming the channel to round the corners of the rectangular channel cross-section. However, this method requires a large amount of oxidation, and hence a large amount of oxide formation, to convert the rectangular channel cross-section shape to a rounded or circular channel cross-section. Hence, there is a need for a way to manufacture a transistor channel, preferably having a rounded or circular cross-section shape, without having to form excessive oxide about the channel.

SUMMARY OF THE INVENTION

In one aspect, the present invention provides for a method of manufacturing a semiconductor device. The method includes providing a semiconductor structure comprising a semiconductor layer overlying an insulating material and forming a patterned mask over said semiconductor layer. The method further includes patterning the semiconductor layer to form a source region, a channel region, and a drain region in the semiconductor layer, wherein the channel region extends between the source region and the drain region. The channel region corners are rounded by annealing, and the patterned mask is then removed. In some embodiments, the method may further include forming a gate dielectric and a gate electrode about the rounded channel region. In some embodiments, the method may further include trimming the patterned mask prior to the annealing step. In yet other embodiments, the channel region includes two, closely spaced features that form a tube-like channel region when annealed.

In another aspect, the invention provides for a semiconductor device having an insulating layer over an underlying layer. The device also has a layer of semiconductor material over the insulating layer, the semiconductor layer having a source region, a drain region, and a horizontal nano-wire structure extending between the source and drain regions. The nano-wire structure is in contact with said insulating layer. The device includes a gate dielectric formed on the surface of at least a segment of the nano-wire structure and a gate electrode formed on the surface of the gate dielectric. In some embodiments, the nano-wire structure has a diameter of less than about 20 nm. In other embodiments, the nano-wire structure is formed of two thin semiconductor features that fuse together to form a substantially hollow tube during an anneal step. The nano-wire may have a cross section that is substantially circular, oval, elliptical, square, rectangular, or other shape.

An advantageous feature of the present invention is that the likelihood of necking (narrowing down) or breaking of the nano-wire is reduced or possibly eliminated. Another advantageous feature of the present invention is that the agglomeration of silicon atoms in or near the source and drain regions is substantially reduced.

BRIEF DESCRIPTION OF THE FIGURES

For a more complete understanding of the present invention, and the advantages thereof, reference is now made to the following descriptions taken in conjunction with the accompanying drawings, in which.

DETAILED DESCRIPTION

The use of presently preferred embodiments is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Example embodiments of the present invention will be described herein in a specific context of making semiconductor devices, such as transistors. In other embodiments not shown, embodiments of the present invention also may include nano-wires or quantum-wires formed in accordance with the present invention. The present invention may also be applied, however, to other situations.

Figure 1A:
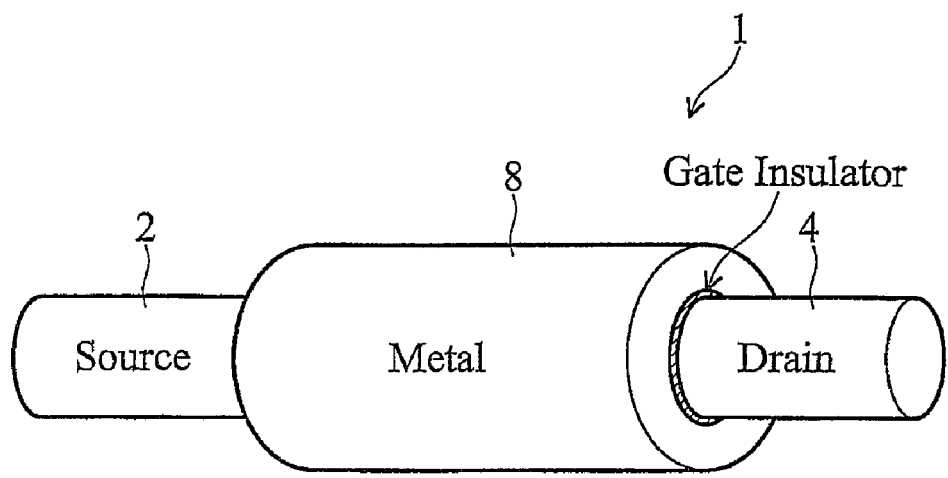
FIG. 1a shows in perspective an exemplary surround-gate or gate-all-around transistor employing a nano-wire channel region, which is also shown in cross sectional view in FIG. 1b.
Figure 1B:
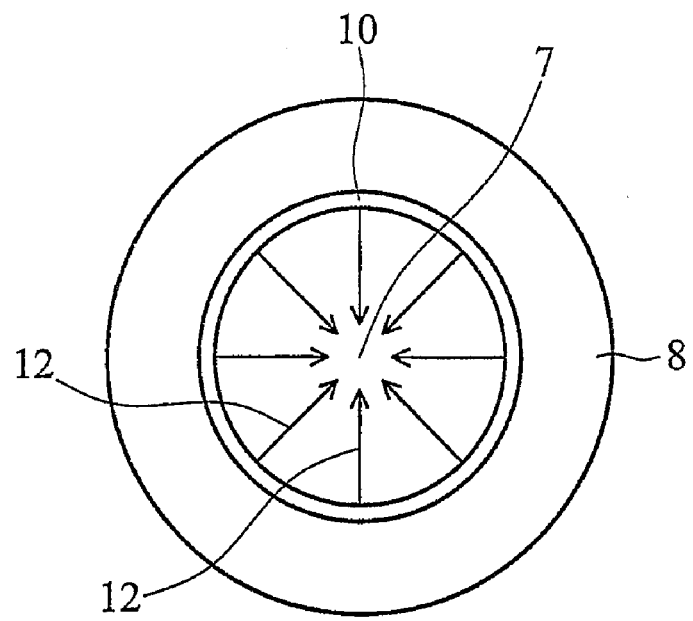
Figure 2A:
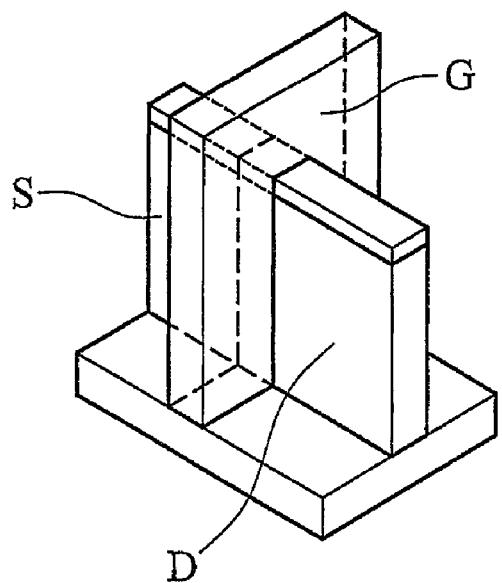
FIG. 2a shows a double-gate FinFET.
Figure 2B:
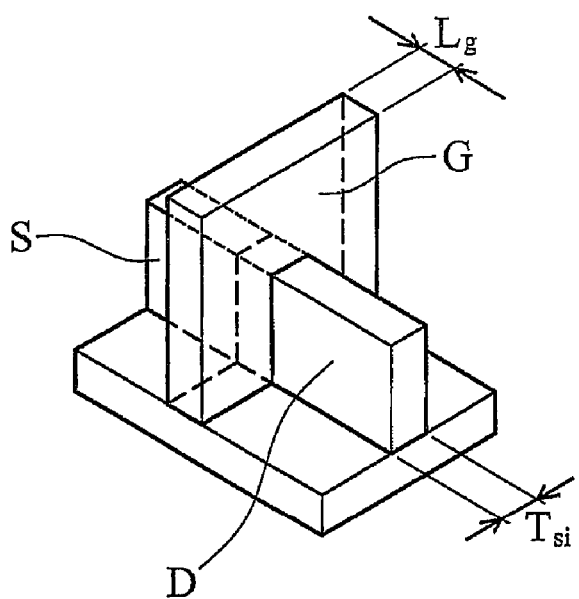
FIG. 2b shows an Omega FinFET.
Figure 2C:
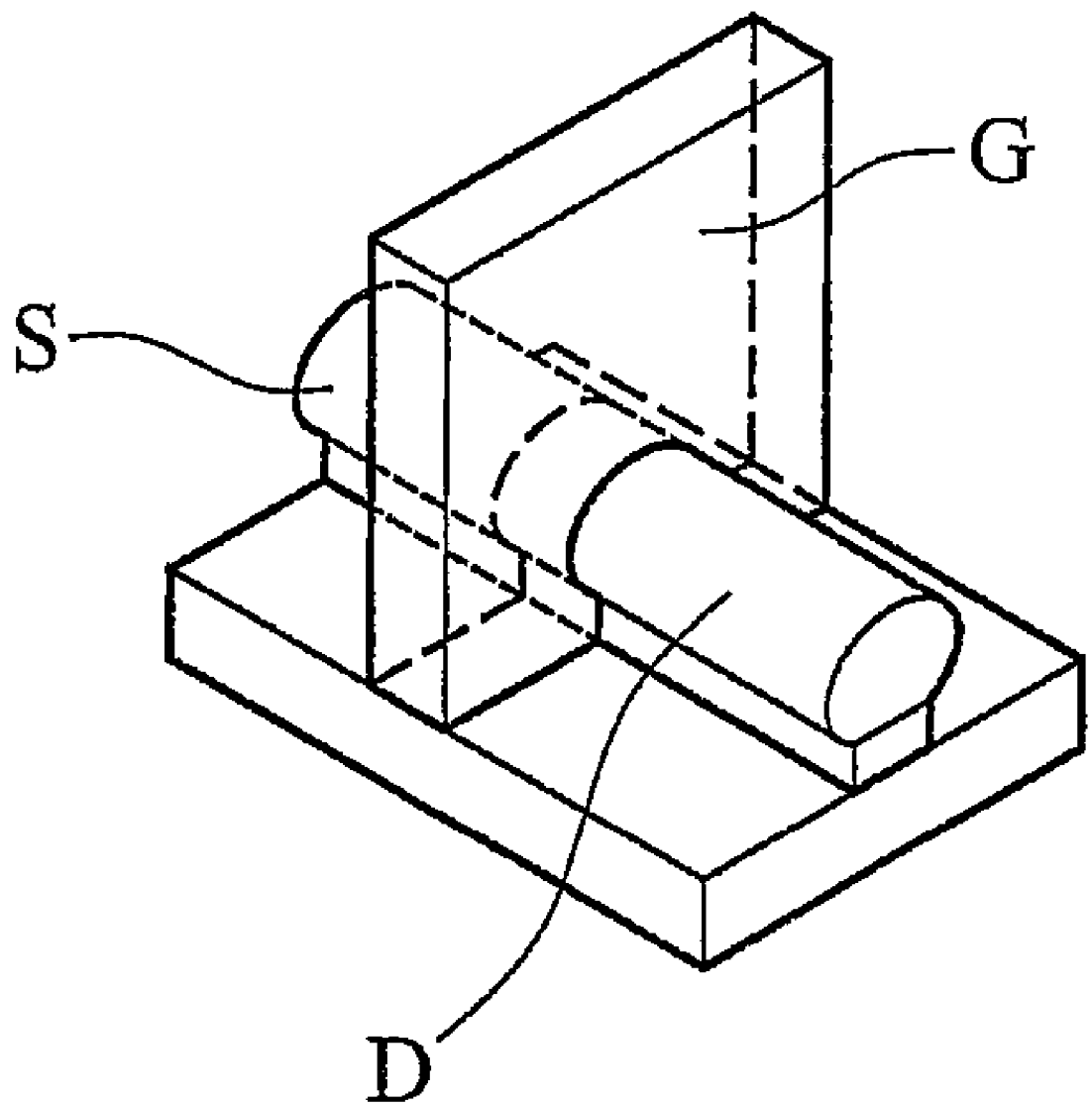
FIG. 2c shows a Nano-wire FinFET.

FIGS. 2a through 2c show the evolution of multiple-gate transistors or FinFETs. FinFETs are essentially field effect transistors with a fin-like or wire-like body region, as illustrated in FIG. 2. The conventional double-gate FinFET device is taught in U.S. Pat. No. 6,413,802 B1 issued to Hu, et al. As illustrated in FIG. 2a, the double-gate transistor has a gate electrode that straddles across the channel or the fin-like silicon body, thus forming a double-gate structure. There are two gates, one on each sidewall of the silicon fin, as shown in FIG. 2a.

Improvements to the double-gate FinFET has led to omega-FinFET, as illustrated in FIG. 2b. The Omega ($\Omega$) field effect transistor (FET), or omega-FinFET has a gate electrode that has an omega-shape in its cross-sectional view. The encroachment of the gate electrode under the semiconductor fin or body forms an omega-shaped gate structure. It closely resembles the Gate-All-Around (GAA) transistor for excellent scalability, and uses a very manufacturable process similar to that of the double-gate or triple-gate transistor. Details of the omega-FinFET are documented in Fu-Liang Yang, et al., "25 nm CMOS Omega-FETs," *IEEE International Electron Device Meeting, Technical Digest*, pp. 255-258, San Francisco, Calif., December 2002, which paper is incorporated herein by reference.

Earlier versions of FinFET have sharp edges or corners on the semiconductor fin or channel region. Regions near the sharp corners, where the radius of curvature is relatively small, turn on or form an inversion layer at a lower gate voltage, and therefore potentially contribute to a high off-state leakage current between the source and the drain. The high local electric field at sharp corners also negatively impacts the gate dielectric integrity. Therefore, a further improvement to the omega FinFET, according to one embodiment of this invention, is the use of a nano-wire to form the body or channel of the FinFET.

Yet another advantage of using the nano-wire-FinFET structure of this invention is the relaxation of the silicon body width $T_{Si}$ requirement. The $T_{Si}$ requirement arises from the fact that when $T_{Si}$ is too large, short channel effects worsen, leading to high off-state leakage. To achieve adequate suppression of short-channel effects, a maximum $T_{Si}$ is specified and this maximum $T_{Si}$ is dependent on the device structure used. If $T_{Si}$ is too small, particularly when it is smaller than the minimum feature size or gate length $L_g$, it becomes an unnecessarily restrictive requirement that is often undesirable from the perspective of manufacturability and device performance. For example, it is desired that the smallest feature size in a device is the gate length and not the silicon body width. As illustrated in FIG. 2a, for the double-gate FinFET structure, it can be empirically determined that the maximum $T_{Si}$ for adequate suppression of short-channel effects is $(2/3)L_g$. Requiring that the maximum $T_{Si}$ is smaller than $L_g$ is an undesirable attribute of the double-gate FinFET. An omega-FinFET [FIG. 2b] relaxes the $T_{Si}$ requirement so that a maximum $T_{Si}$ of $L_g$ will be acceptable for effective control of short-channel effects. The nano-wire FinFET of the preferred embodiments of the present invention [FIG. 2c] relaxes the requirement even further, requiring a maximum $T_{Si}$ of $2L_g$. The nano-wire FinFET's relaxed requirement on $T_{Si}$ therefore enlarges the device design space and may also enhance manufacturability.

Despite the fact that the maximum $T_{Si}$ required for nano-wire FinFETs is relaxed compared to double-gate or omega-FinFETs, the value of $T_{Si}$ to be employed in sub-20 nm gate length nano-wire-FinFET is still about 40 nm or smaller. This is a very small dimension. In order to form nano-wires suitable for the fabrication of nano-wire-FinFET devices with sub-20 nm gate lengths, a method of reliably controlling the diameter of nano-wires is important. The formation of nano-wires with such small diameters is particularly challenging since nano-wires with such narrow diameters break easily.

Further information relating to preferred methods and structures for FinFET devices, while relevant but not necessary for an understanding of the present invention, may be found in the following co-pending and commonly owned U.S. patent applications, each of which is incorporated herein by reference: Ser. No. 10/314,249, filed Oct. 6, 2002, entitled "Multiple-Gate Transistor and Methods of Manufacture,"; Ser. No. 10/305,841, filed Nov. 26, 2002, entitled "Strained-Channel Multiple-Gate Transistor,"; Ser. No. 10/370,792, filed Feb. 20, 2003, entitled "Semiconductor Nano-Rod Devices,"; Ser. No. 10/319,119, filed Dec. 12, 2002, entitled "Semiconductor-On Insulator Chip Incorporating Partially-Depleted, Fully-Depleted, and Multiple-Gate Devices,"; Ser. No. 10/401,087, filed Mar. 26, 2003, entitled "Semiconductor-On-Insulator Chip Incorporating Partially-Depleted, Fully-Depleted, and Multiple-Gate Devices,"; Ser. No. 10/313,887, Dec. 6, 2002, entitled "CMOS Inverters Configured Using Multiple-Gate Transistors,"; Ser. No. 10/305,728, filed Nov. 26, 2002, entitled "CMOS SRAM Cell Configured Using Multiple-Gate Transistors,"; Ser. No. 10/377,479, filed Feb. 27, 2003, entitled "Contacts to Semiconductor FIN Devices,"; Ser. No. 10/425,156, filed Apr. 29, 2003, entitled "Doping of Semiconductor Fin Devices,"; Ser. No. 10/608, 287, filed Jun. 27, 2003, entitled "Structure and Method for Forming the Gate Electrode in a Multiple-Gate Transistor,".

Our previous invention, Ser. No. 10/370,792, filed Feb. 20, 2003, entitled "Semiconductor Nano-Rod Devices," detailed a particular method of forming a nano-wire or nano-rod field effect transistor. Experimental results indicate that the method taught in that prior application is adequate for forming nano-wires with diameters larger than about 20 nm.

Figure 3A:
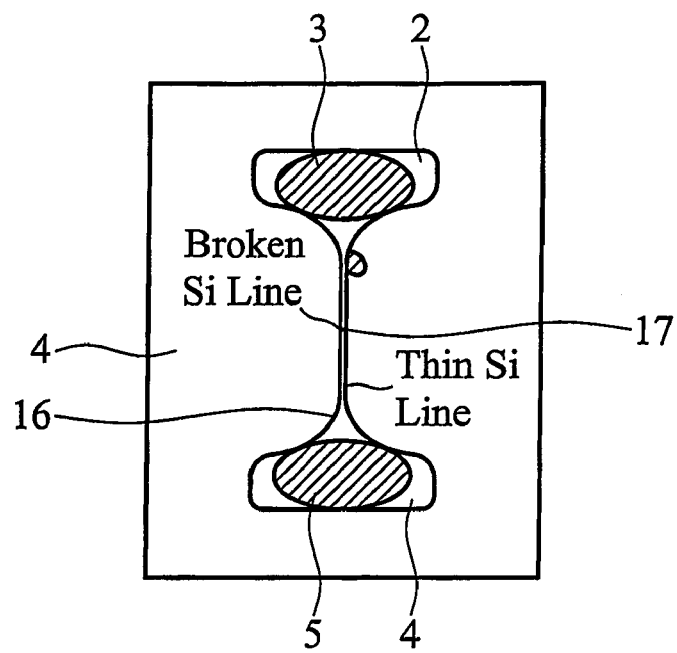
FIGS. 3a through 3f illustrate broken and narrowed nano-wires that may occur using a hydrogen annealing process.
Figure 3B:
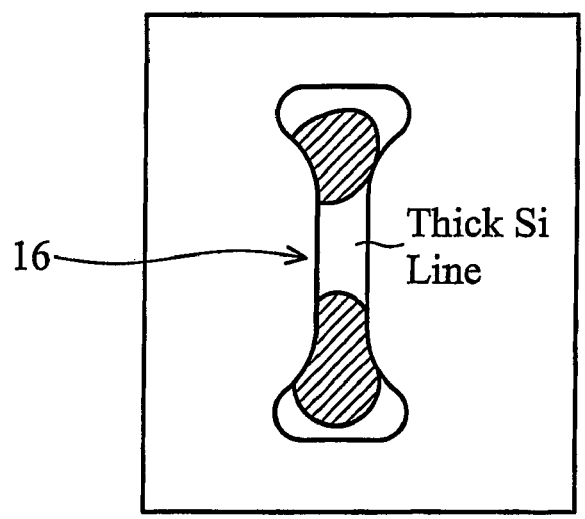
Figure 3C:
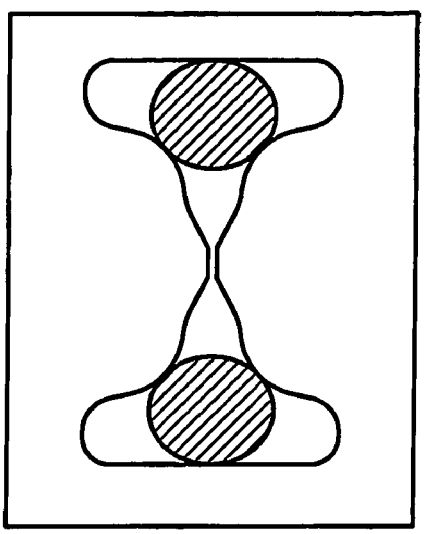

For nano-wires with diameters smaller than 20 nm, serious problems related to the breaking of nano-wires during hydrogen anneal may occur. Such problems are illustrated in FIG. 3, where the top view of silicon active regions observed using scanning electron microscopy (SEM) are illustrated. In FIG. 3a, a silicon active region 14 which comprises a thin silicon line 16 (which will in fact be the channel region in the preferred embodiment FinFET device) is annealed in a hydrogen ambient to form a nano-wire with a rounded cross-section. The annealing temperature is typically 950 degrees Celsius, pressure is 10 Torr, and anneal time is 60 seconds. The rounding of corners of the source and/or drain regions 2 and 4 respectively, are also noticeable in addition to the formation of nano-wires with a rounded cross-section. The anneal facilitates silicon atom migration which contributes to the rounding effect. A direct result of the silicon migration is the agglomeration of silicon in regions 3 and 5 in the large source or drain regions 2 and 4, respectively, as indicated in FIG. 3a. Excessive silicon migration from the thin silicon line 16 to agglomerate with other silicon atoms in the source 2 or drain 4 regions leads to the breaking of the silicon line 16 at a point 17, as shown in FIG. 3a. While breaking point 17 is illustrated as being at or near the mid-point of silicon line 16, this is not always or necessarily the case. Silicon line 16 may neck down and/or break at other locations along its length. By contrast, a silicon line 16 with a much larger width, such as that shown in FIG. 3b, is not broken. Such a thick silicon line is disadvantageous, however, since the resulting device would be a planar device. Unlike a multiple-gate transistor, a planar device formed from a thick silicon line would have limited scalability. In FIG. 3c, an active region with a different layout or perimeter is shown. Near breaking of silicon lines is also observed.

Figure 3D:
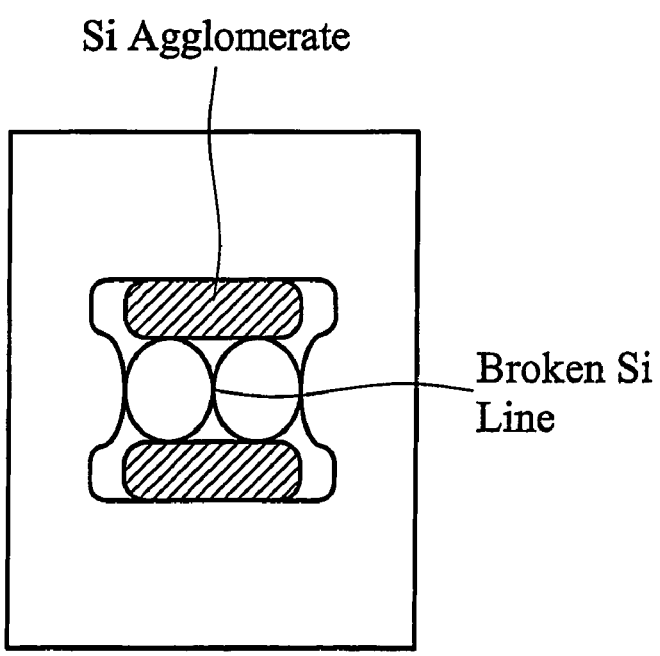
Figure 3E:
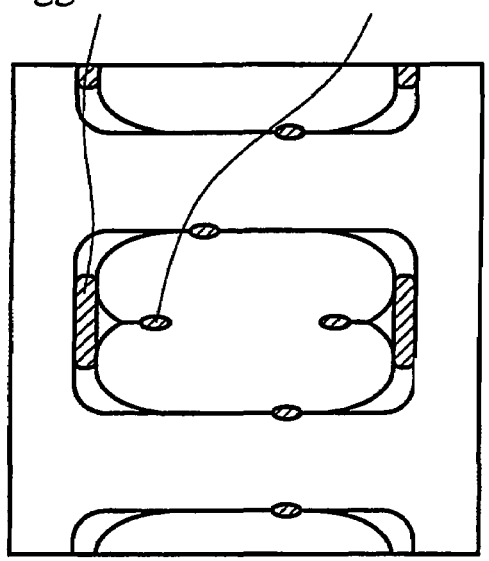
Figure 3F:
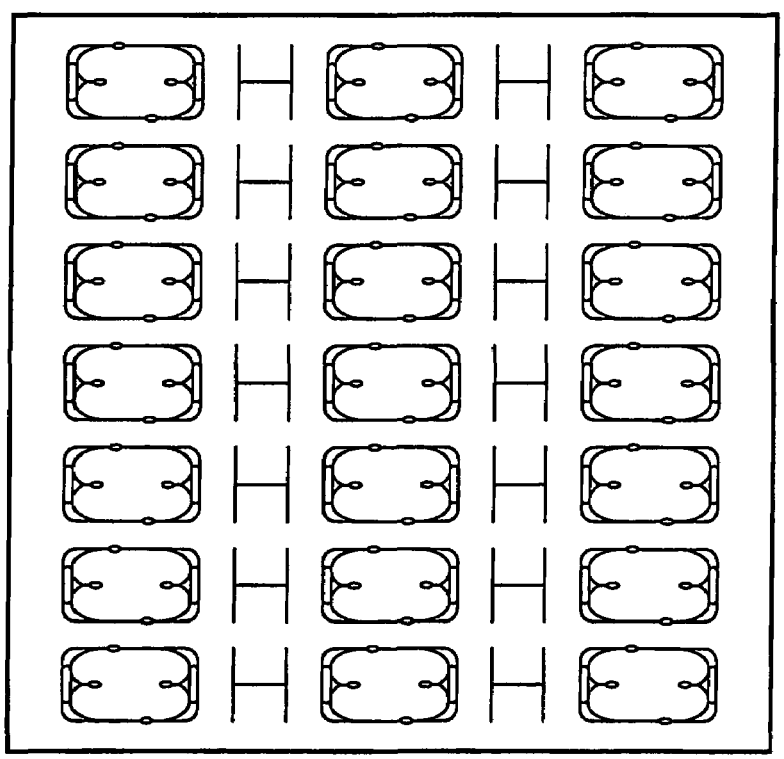

The observation of broken or nearly broken silicon lines or silicon nano-wires upon annealing in hydrogen ambient is also noted for layouts where there are multiple silicon lines connecting between the source and drain regions. This is shown in FIG. 3d where the silicon lines are broken or almost broken. In FIG. 3e, where there are 3 parallel silicon lines, one silicon line located in the middle is broken. FIG. 3f shows a low magnification view of an array of nano-wire structures, illustrating that the problem of broken silicon lines is common in many neighboring layouts.

Figure 4A:
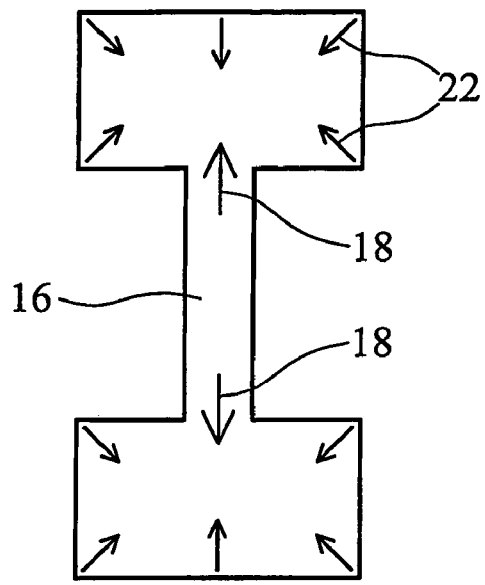
FIGS. 4a and 4b schematically illustrate the migration of atoms of the active region during the anneal process, resulting in the formation of broken nano-wires.
Figure 4B:
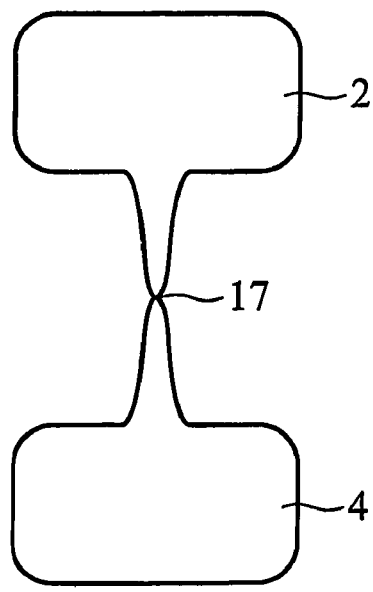

FIG. 4 conceptually illustrates the silicon migration and impact on the nano-wire. Annealing in hydrogen ambient at elevated temperatures encourages silicon atom migration and forms nano-wires with round cross-sections. To form a nano-wire 16 with a substantially round cross-section, a re-distribution of silicon atoms within the nano-wire is sufficient to achieve the desired result. However, in reality, as shown in FIG. 4a, silicon atoms also migrate from the nano-wire towards the source and drain region (as indicated by the bold arrows 18) during the hydrogen anneal process. It is the migration of silicon atoms away from the nano-wire that leads to a phenomenon of nano-wire necking. When there is extreme necking, such as that shown in FIG. 4b, the nano-wire is broken after the anneal. The migration of silicon atoms from the outer regions of source and drain regions 2 and 4, respectively, is also illustrated in FIG. 4a by the arrows 22. This migration leads to corner rounding of the source and drain regions as well as during annealing, as also shown in FIG. 4b.

Figure 5A:
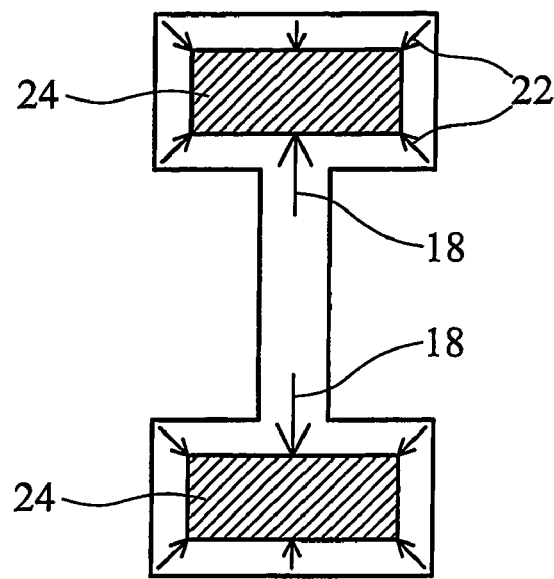
FIGS. 5a and 5b preferred embodiment of this invention, in which the area available for silicon atoms to migrate is drastically reduced.

To avoid the problems of too much silicon atom migration from the silicon nano-wire to the source and drain regions, the preferred embodiments of the present invention provide for the insertion of a masked region on at least one of the source and drain regions. This is schematically illustrated in FIG. 5a. The mask 24 comprises a material to which silicon atoms do not migrate, such as silicon nitride, silicon oxynitride, silicon oxide, or other dielectric. Since silicon atoms do not migrate to a region comprising the mask material, the amount or extent of silcon migration to the source and/or drain regions is limited. FIG. 5a shows some silicon migration occurs (shown by the arrows 18 and 22), but the amount of silicon atom migration is significantly reduced by the inclusion of mask 24.

Figure 5B:
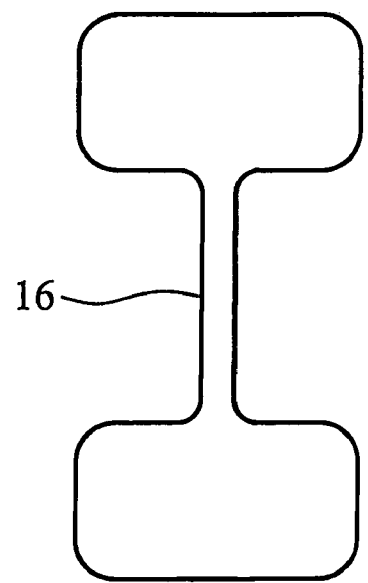

By restricting silicon atom migration from the nano-wire to the source and/or drain regions, the necking problem is resolved or the likelihood of forming a broken silicon nano-wire is reduced. The top view of the anneal silicon nano-wire is illustrated in FIG. 5b. Note the schematically illustrated absence of necking of nano-wire 16.

Figure 6:
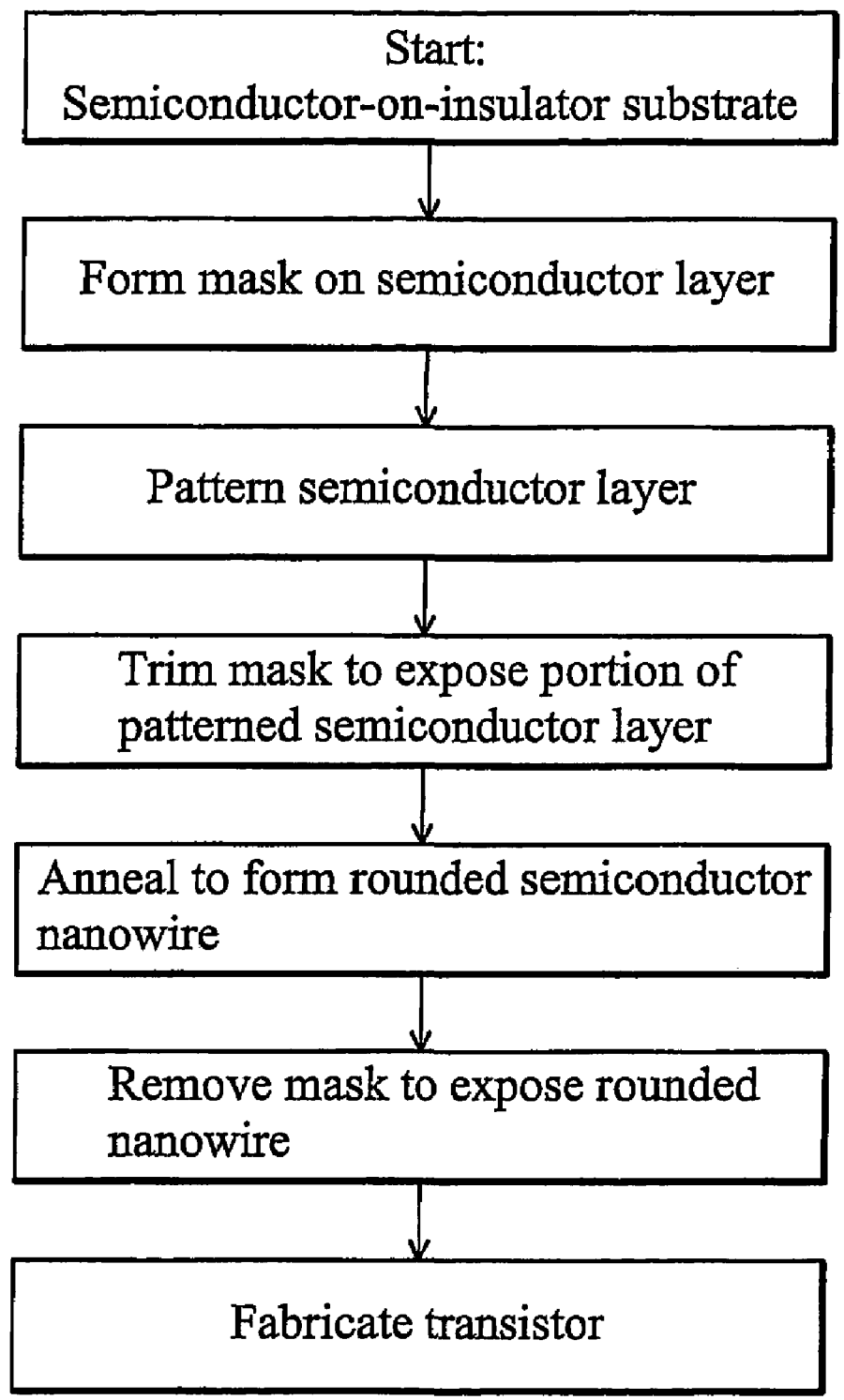
FIG. 6 shows a flow-chart illustrating the process flow of preferred embodiments of this invention to form a rounded nano-wire.

FIG. 6 shows an example of the process flow for forming a nano-wire without the abovementioned problem. Some of the manufacturing steps of this preferred embodiment being used to make a nano-wire FinFET embodiment are illustrated in FIGS. 7a-(h). While describing the structure formation steps shown in FIGS. 7a-(h), process parameters and steps for the preferred embodiment will be described, as well as some of the possible alternatives or variations of the process parameters and steps. However, the process parameters shown and/or described herein are merely examples to illustrate and describe the present invention. With the benefit of this disclosure, one of ordinary skill in the art will likely realize other variations and embodiments of the present invention within the scope and spirit of the appended patent claims.

FIG. 7 shows the three-dimensional perspective of one transistor device being manufactured in an integrated circuit (IC) chip using one embodiment of the process flow. Such an IC chip will often have millions or perhaps billions of these transistors. However, for purposes of illustration and discussion, only one transistor device is shown.

First, a semiconductor-on-insulator substrate comprising a semiconductor layer overlaying an insulator layer is provided. When the semiconductor layer is silicon, this type of structure is sometimes referred to as a silicon-on-insulator substrate and is commonly available as a starting material. It should be noted that in this invention, the semiconductor layer may be comprised of an alloy semiconductor such as silicon-germanium (SiGe), silicon-germanium-carbon (SiGeC), or silicon-carbon (SiC). The semiconductor layer may also comprise a binary III-V semiconductor such as gallium arsenide and indium antimonide or comprise a ternary III-V semiconductor such as gallium indium arsenide. The semiconductor layer may also comprise an elemental semiconductor such as silicon or germanium. Accordingly, a rounded semiconductor nano-wire may be formed from the semiconductor layer constituting the starting material.

Figure 7A:
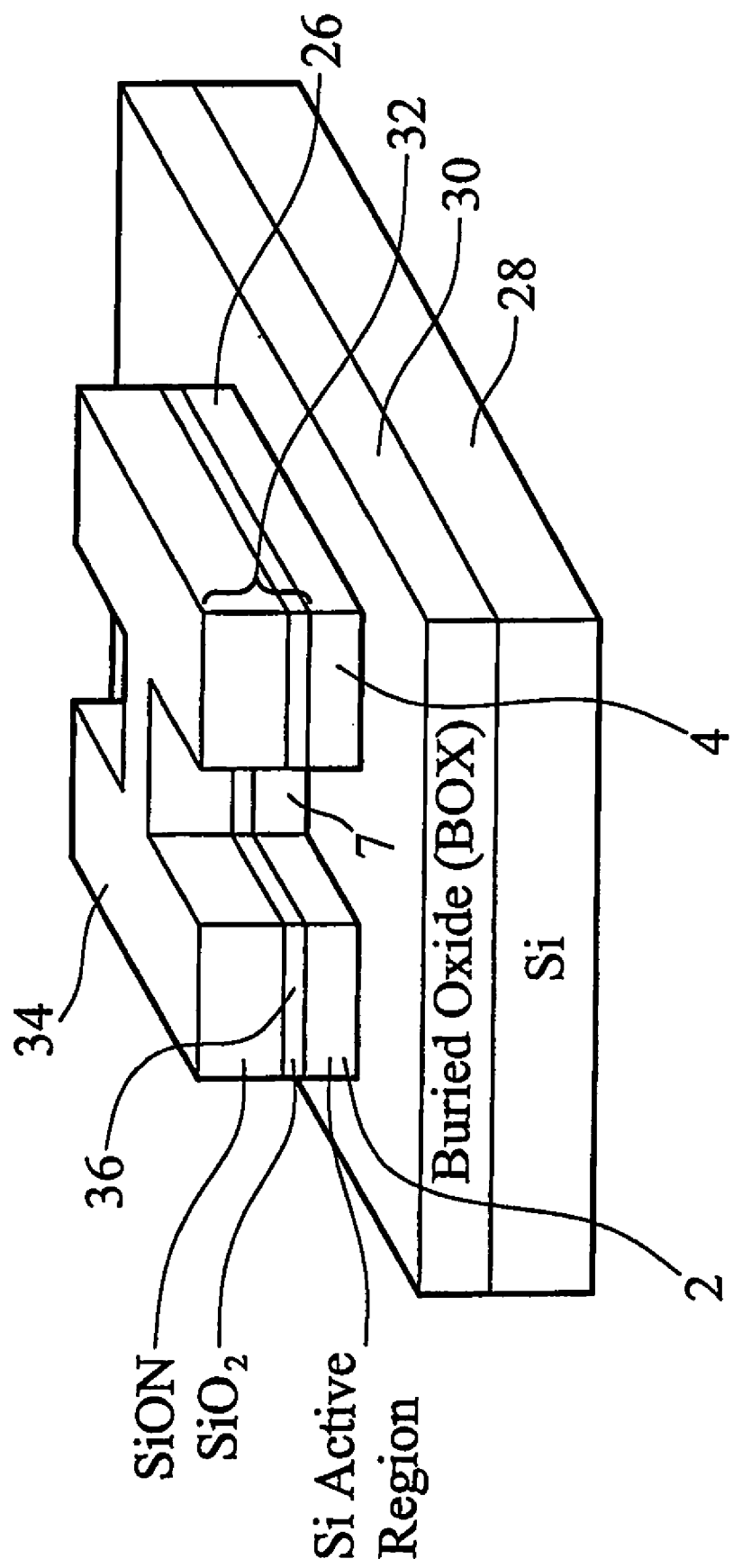
FIGS. 7a through 7h show a series of device structures formed at the various steps of the process flow of FIG. 6.

A mask 32 is formed over the semiconductor layer. In the preferred embodiment, the mask comprises a topmost silicon oxynitride layer 34 overlying a silicon oxide layer 36 (FIG. 7a). The silicon oxide layer 36 is also known as a pad oxide layer and may be thermally grown in a $O_2$ or $H_2O$ ambient at temperatures in the range of 600 degrees Celsius to 1100 degrees Celsius. The thickness of the silicon oxide layer 36 is preferably between 10 angstroms and 300 angstroms, although thicknesses outside this range may also be used. The silicon oxynitride layer 34 may be deposited by chemical vapor deposition at temperatures in the range of 300 degrees Celsius to 900 degrees Celsius. The thickness of the silicon oxynitride layer 34 is preferably in the range of 100 angstroms to 4000 angstroms. In general, the mask may also be a single-layer mask, or a multi-layered mask. The mask is then patterned using photolithography. A photoresist (not shown) used in the photolithography process may or may not be removed at this step. The mask 32 is then used to etch the underlying semiconductor layer 26. An anisotropic etch or a dry plasma etch is preferably employed. For example, in FIG. 7a, the semiconductor layer is silicon, and the insulator layer 30 is a buried silicon oxide. After the etching of the semiconductor layer, an active region is formed. The process step illustrated in FIG. 7a is also known as active region definition.

In FIG. 7a, the patterned semiconductor layer or active region remains in the form of an H-shaped, thin silicon island 26. However, in other embodiments (not shown), the patterned semiconductor layer may have other shapes (e.g., U-shaped, V-shaped, I-shaped, L-shaped, etc.). The thickness of the patterned silicon layer or island may range from about two angstroms to about 1000 angstroms, for example. The patterned silicon layer has a source region 2, a drain region 4, and a channel region 7. The channel region 7 extends between the source region and the drain region. As shown in FIG. 7a, the channel region has a width that is much narrower than the contact pad portions and of the source and drain regions.

The underlying layer 28 beneath the insulator or buried silicon oxide (BOX) 30 layer will often be a silicon wafer, for example. However, the underlying layer may be comprised of another type of material, including but not limited to: an elemental semiconductor, such as germanium; an alloy semiconductor, such as silicon-germanium; or a compound semiconductor, such as gallium arsenide or indium phosphide, for example.

Figure 7B:
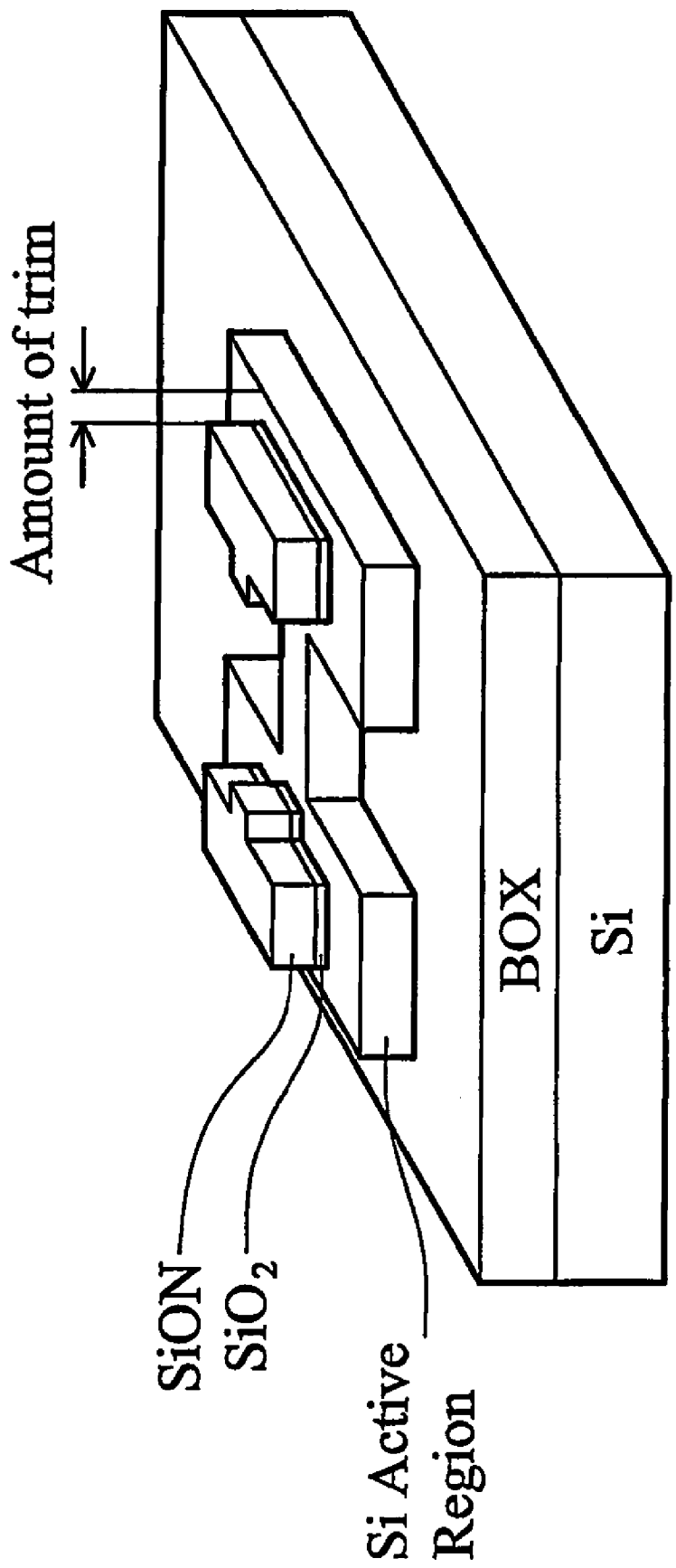

Next, the patterned mask is trimmed such that it recedes from the edge of the active region, as shown in FIG. 7b. The amount of trim or the distance by which the patterned mask recedes from the edge of the active region is preferably in the range of 20 angstroms to 5000 angstroms. The trimming can be performed by using a wet etch or a dry plasma etch process. According to this invention, the patterned mask is not completely removed at this step.

Figure 7C:
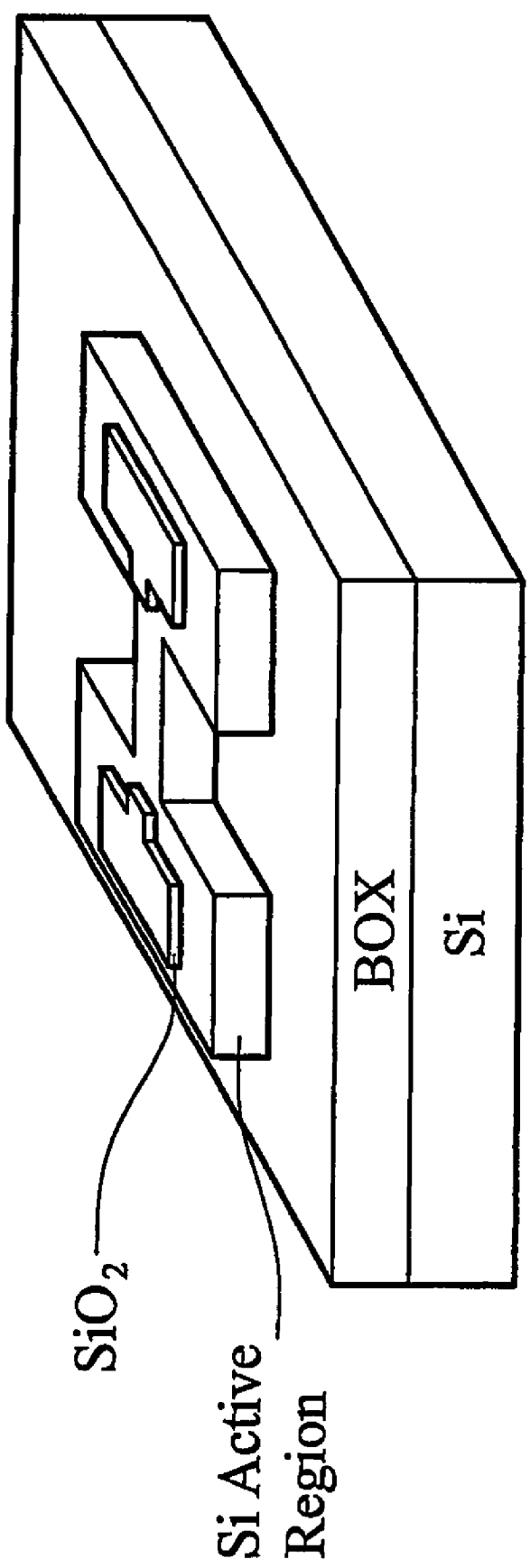

The topmost layer of the mask, if it is a multi-layer mask, may be optionally removed. For example, the topmost silicon oxynitride layer of the mask in the preferred embodiment, may be removed to give the structure as shown in FIG. 7c. This can be performed by using a wet etch in hot (approximately 150 to 170 degrees Celsius) phosphoric acid.

Figure 7D:
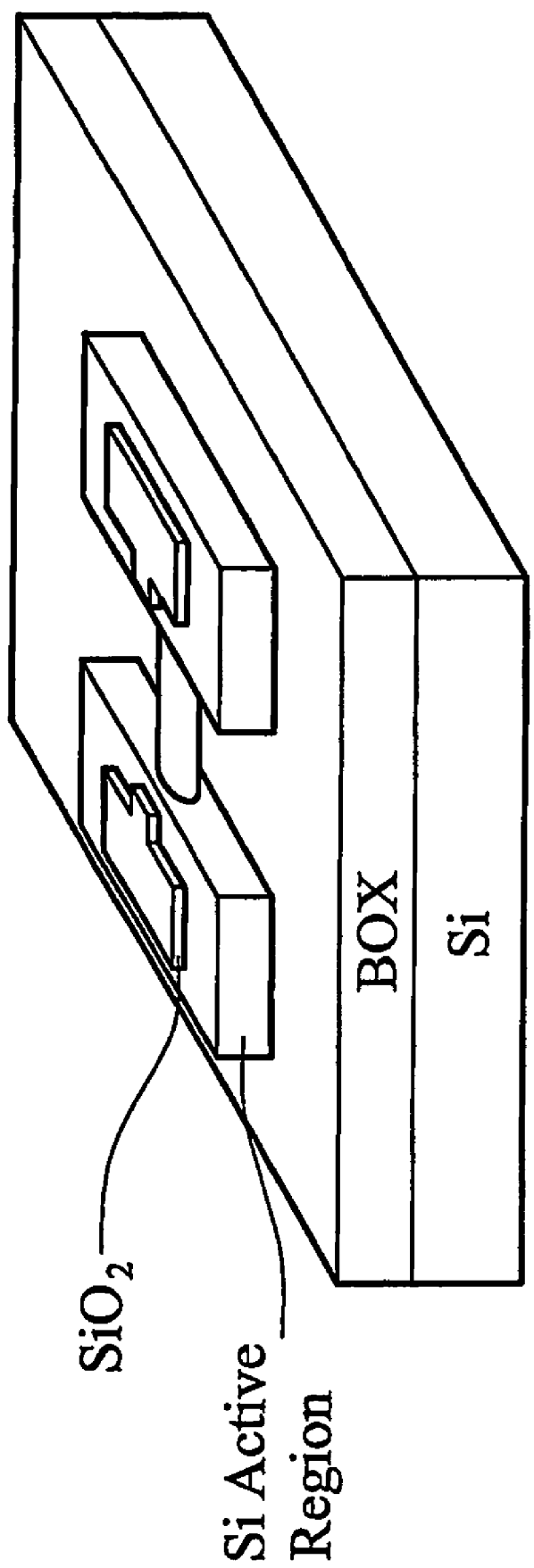

Next, the silicon atoms in the patterned silicon layer are re-arranged by annealing the silicon layer at elevated temperatures [FIG. 7d]. The re-arrangement is induced by surface migration of silicon atoms driven by a tendency to minimize surface tension. During the annealing, the re-arrangement of the atoms at the narrow channel region causes the corners of the channel region to be rounded to transform the channel region into a nano-wire structure. If carried out long enough and/or under sufficient heat, the resulting nano-wire structure may be completely rounded having a circular-shaped cross-section. The contact pad portions of the source and drain regions will also likely experience slight shape changes, such as rounding of at least some of their corners. The contact pad portions of the source and drain regions serve to provide a portion onto which metallic or conductive materials form electrical connection with the source and drain regions. It is understood that the contact pad is an optional feature of this invention. If the contact pad portions of the source and drain regions are omitted, the patterned semiconductor layer may be I-shaped, for example. In this case, the electrical connection between the metallic or conductive material and the source and drain regions may be formed directly on the nanowire structure.

Example parameters for the annealing process used to round the corners of the channel region will be described next. The temperature for the annealing process may range from about 600 degrees Celsius to about 1200 degrees Celsius. The anneal time may range from about one second to about two hours. The pressure in the reaction chamber (not shown) used for the annealing process may vary, depending in part upon the environment within the reaction chamber. The reaction chamber may be a chemical vapor deposition (CVD) epitaxial reactor, for example. The annealing process may occur in a reaction chamber having an environment of hydrogen gas ($H_2$) at a partial pressure ranging from about $1.0 \times 10^{-9}$ torr to about 800 torr. In another embodiment, the annealing environment may be evacuated (i.e., a vacuum environment) at a pressure ranging from about $1.0 \times 10^{-10}$ torr to about $1.0 \times 10^{-3}$ torr. In still another embodiment, the annealing environment may be nitrogen gas ($N_2$) at a pressure ranging from about $1.0 \times 10^{-9}$ torr to about 800 torr. The annealing environment may also be one of the following environments (but not limited to): an environment of a mixed gas including hydrogen and argon; an environment of a mixed gas including hydrogen and nitrogen; an environment with other gases in addition to hydrogen to form a mixed gas ambient; or an environment of an inert gas, for example.

Figure 7E:
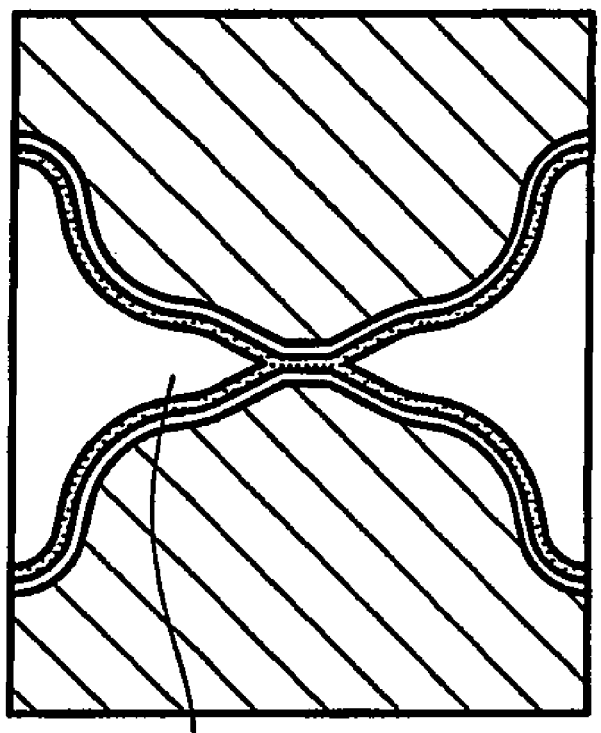

In a preferred embodiment, the annealing process is performed in a hydrogen gas ($H_2$) ambient at about 900-950 degrees Celsius for about 1 minute. An example of the annealed structure is shown in FIG. 7e.

Figure 7F:
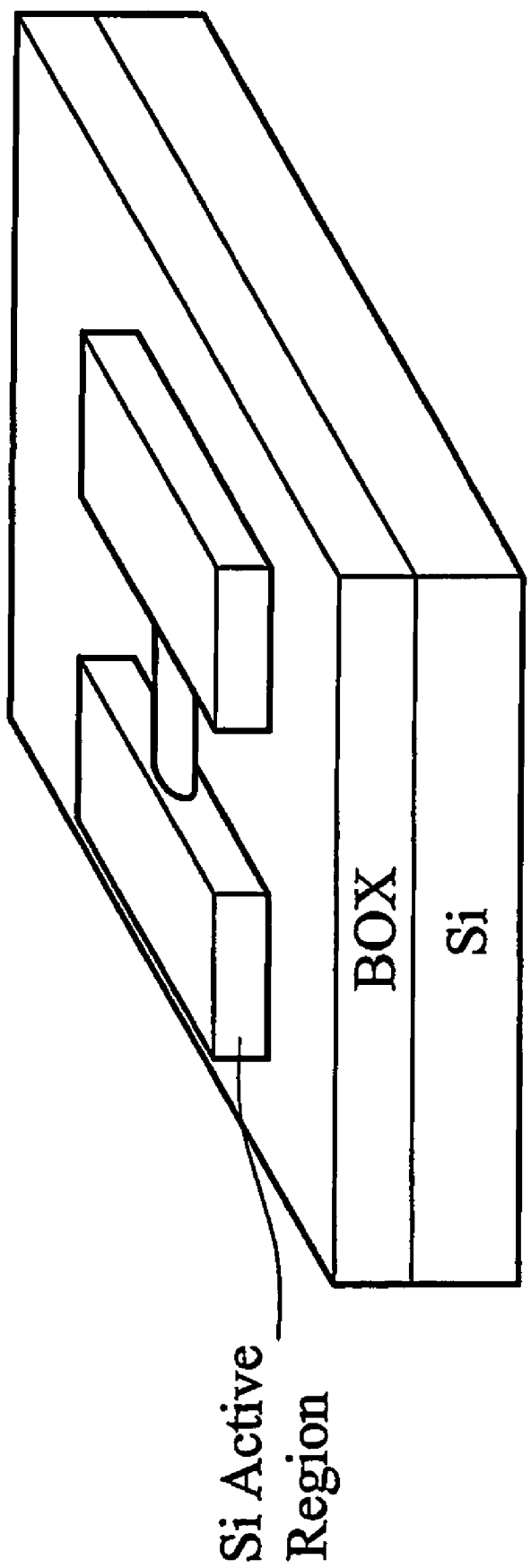

The mask layer or remaining portion of the mask layer may be completely removed at this step. In the preferred embodiment, the pad oxide layer is removed, as shown in FIG. 7f. Removal of the pad oxide layer is preferably done using a wet etch in dilute hydrofluoric acid (HF). In the above described embodiment, a single masking layer is used to both define the active area island 26 and also to mask the source and/or drain regions during the anneal process. In an alternative embodiment, two different masking layers could be employed. One masking layer could be employed for defining and patterning the active area island, which mask may be removed, followed by definition of a second, separate mask to define the masked regions for the annealing step. While this embodiment would eliminate the need to trim the mask, as described above, it would involve additional masking definition steps and would not provide the advantage of being self-aligned.

This is followed by gate stack definition. A gate stack comprises a gate dielectric and a gate electrode. A gate dielectric material is formed on the surface of and about the nanowire structure (as well as on the other exposed portions of the silicon layer). The gate dielectric material may be an oxide formed by thermal oxidation or atomic-layer CVD for uniform deposition, for example. Hence, the gate dielectric will likely form on all exposed areas, including the contact portions of the source and drain regions. The gate dielectric material may take the form of a variety of compositions, including but not limited to: silicon dioxide ($SiO_2$), silicon oxynitride ($SiO_xN_y$), $HfO_2$, $ZrO_2$, $Al_2O_3$, $La_2O_3$, or other high permittivity materials, for example.

Figure 7G:
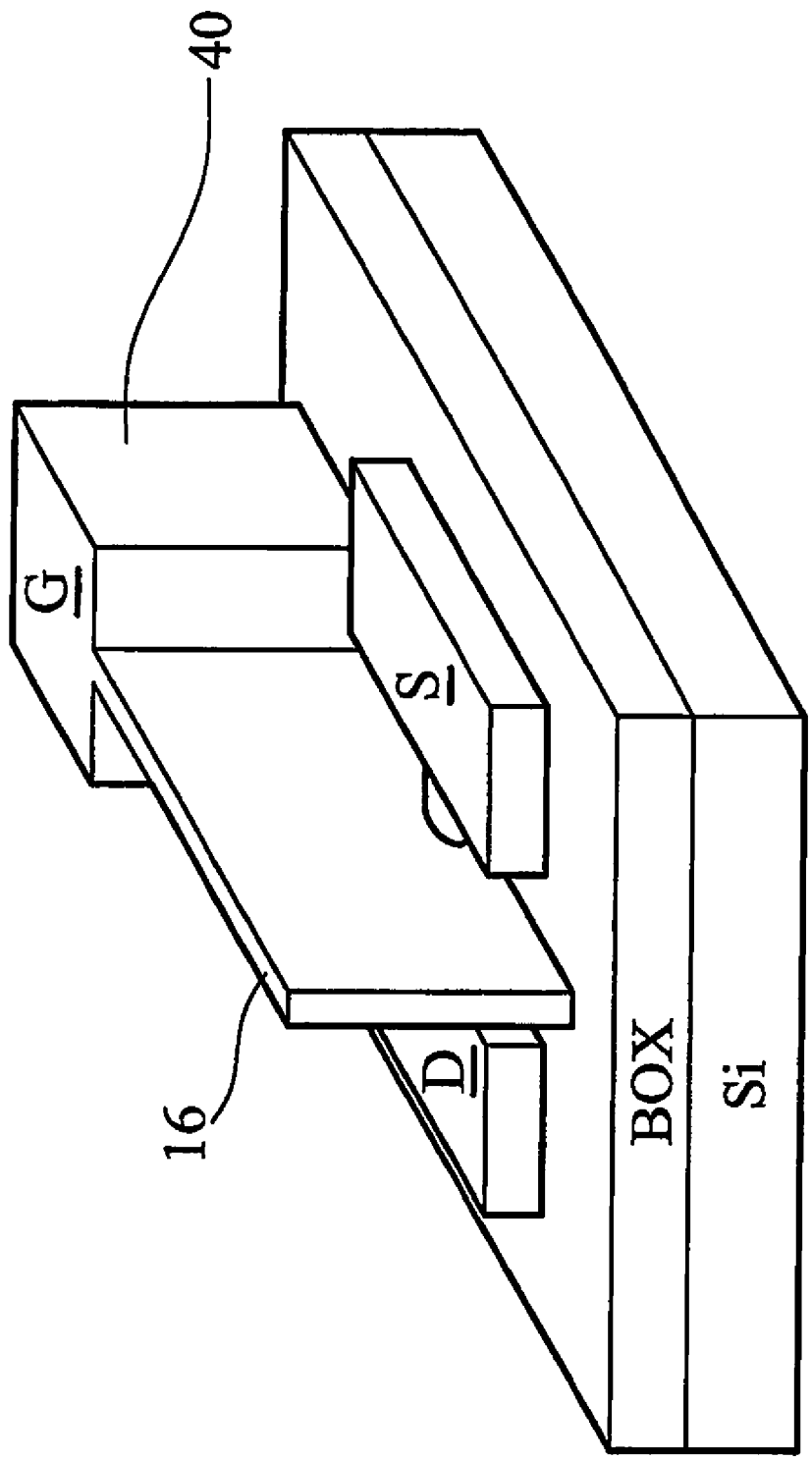
Figure 7H:
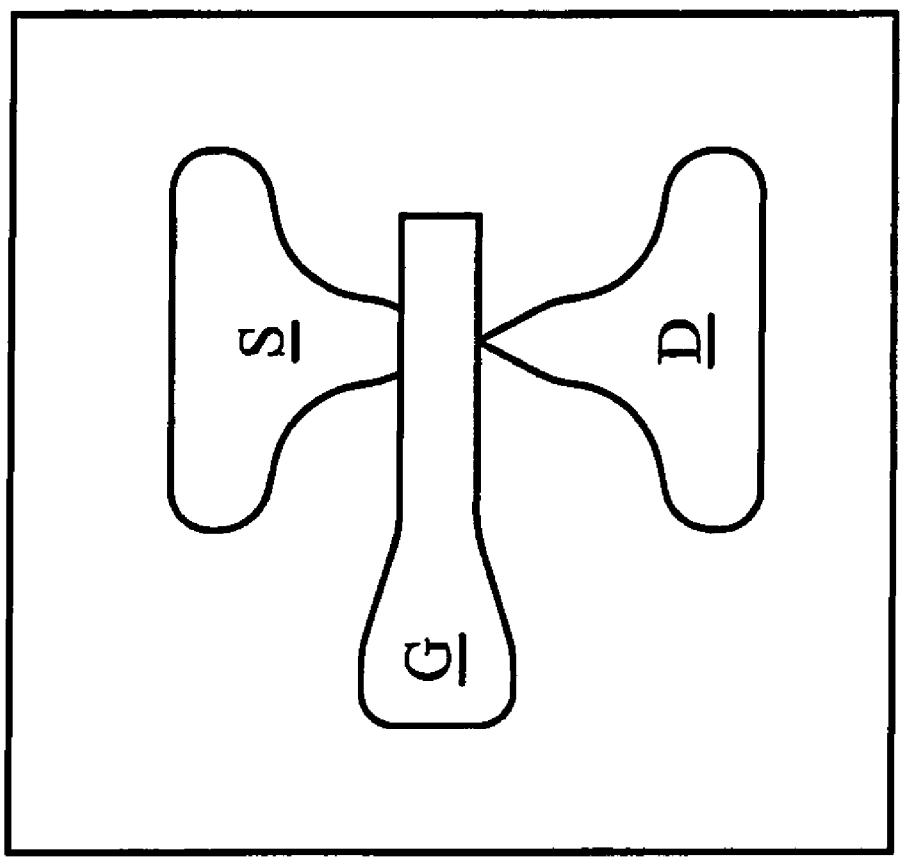
Figure 8A:
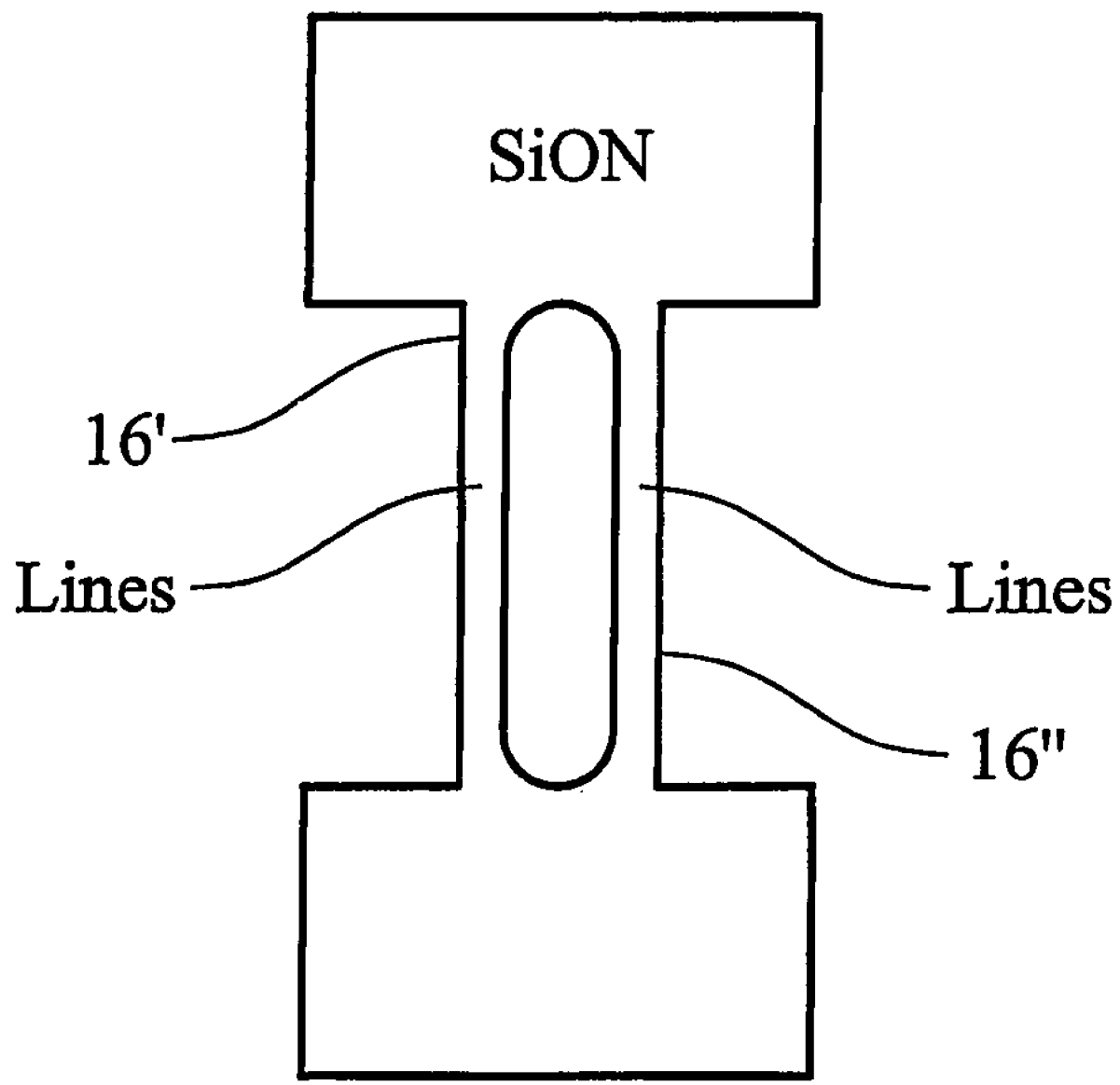
FIGS. 8a through 8d show nano-tube formation according to another embodiment of this invention.
Figure 8B:
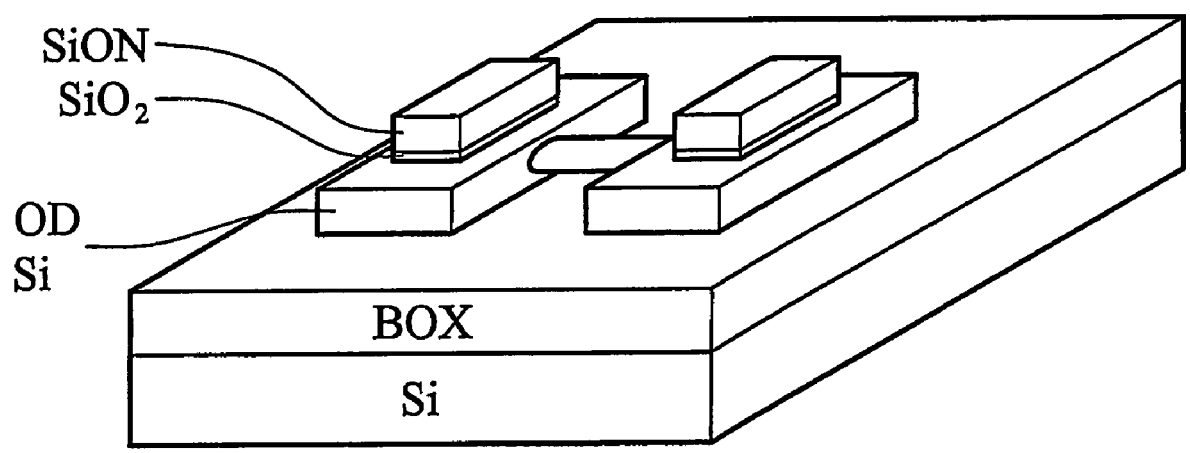
Figure 8C:
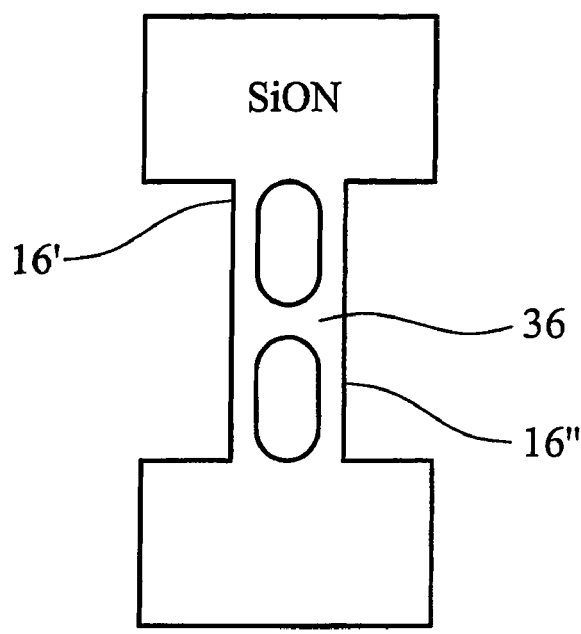
Figure 8D:
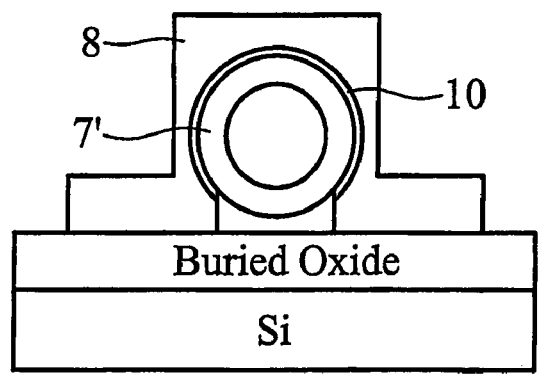

A gate electrode material 40 is then deposited, masked, and etched to form the gate electrode, as shown in FIG. 7g. The gate electrode material may be selected from a variety of materials, including but not limited to: a semiconductor material (e.g., poly-silicon, poly-silicon-germanium); a metal material (e.g., molybdenum, tungsten, titanium); a metallic nitride (e.g., tantalum nitride, titanium nitride); or any combination thereof, for example. During or after the etching of the gate electrode material to form the patterned gate electrode, the gate dielectric material may be removed from the source and drain regions.

Because the gate dielectric is preferably aligned with the gate electrode at the channel, the gate dielectric can be self-aligned with the gate electrode by simply etching the gate electrode material with an etch chemistry that will also etch away the gate dielectric material while being selective against etching the silicon layer. Also, because the gate dielectric at the gate channel is shielded by the gate electrode, the ion implantation processes for doping the silicon layer outside of the channel (i.e., to form the source and drain of the transistor) may be self-aligning as well.

Preferably, the nano-wire 16 has a diameter no larger than about 30 nm, and even more preferably no larger than 20 nm. The diameter of the nano-wire cross-section may be in the order of nanometers (e.g., about 4 nm), and such nano-wires may be used for the channel of a field effect transistor, for example.

Referring now to FIG. 8, a second embodiment of this invention is described as follows. A nanotube instead of a nano-wire may be formed by placing two semiconductor fins or lines 16', 16" in close proximity to each other prior to anneal. The separation between the two semiconductor lines 16', 16" may be less than 10 nm apart, as shown FIG. 8a. A three-dimensional perspective of the structure is depicted in FIG. 8b. The two semiconductor lines may be connected at selected portions 36, such as shown in FIG. 8c. After annealing, a semiconductor nanotube may be formed with a hollow core 7'. While the mechanism for such formation is not fully appreciated, it is speculated that annealing can lead to migration of silicon atoms to form the tube structure. This is not always, or even necessarily the case, however, and the teachings of the present invention are applicable even if the resulting structure does not form an actual tube or only forms an imperfect tube. Gate dielectric 10 and gate electrode 8 may then be formed to complete a semiconductor nanotube transistor device. A cross-section of the device is shown in FIG. 8d. Semiconductor materials previously described for the nano-wire FinFET may be used for the semiconductor nanotube.

Although several embodiments of the present invention have been described in detail, it should be understood that various changes, substitutions and alterations can be made herein without departing from the spirit and scope of the invention as defined by the appended claims. Moreover, the scope of the present application is not intended to be limited to the particular embodiments of the processes, machines, manufactures, compositions of matter, means, methods and steps described in the specification. As one of ordinary skill in the art will readily appreciate from the disclosure of the present invention, processes, machines, manufactures, compositions of matter, means, methods, or steps, presently existing or later to be developed, that perform substantially the same function and/or achieve substantially the same result as the corresponding embodiments described herein may be utilized according to the present invention. Accordingly, the appended claims are intended to include within their scope such processes, machines, manufactures, compositions of matter, means, methods, or steps.

What is claimed is:

1. A method of manufacturing a semiconductor device, the method comprising the steps of:
   providing a semiconductor structure comprising a semiconductor layer overlying an insulating material;
   forming a patterned mask over said semiconductor layer;
   patterning the semiconductor layer to form a source region, a channel region, and a drain region in the semiconductor layer, wherein the channel region extends between the source region and the drain region;
   trimming the patterned mask away from an edge of the semiconductor layer;
   rounding corners of the channel region by annealing while the entire channel region is in direct contact with an underlying support layer; and
   removing said patterned mask after said rounding step.

2. A method of manufacturing a semiconductor device, the method comprising the steps of:
   providing a semiconductor structure comprising a semiconductor layer overlying an insulating material;
   forming a patterned mask over said semiconductor layer;
   patterning the semiconductor layer to form a source region, a channel region, and a drain region in the semiconductor layer, wherein the channel region extends between the source region and the drain region;
   rounding corners of the channel region by annealing, wherein the annealing occurs in an ambient comprising a gas selected from a group consisting essentially of hydrogen, nitrogen, argon, an inert gas, and combinations thereof; and
   removing said patterned mask after said rounding step.

3. The method of claim 1 wherein the trimming of the patterned mask causes the patterned mask to recede from an edge of an active region by between 20 and 5000 angstroms.

4. The method of claim 1 wherein the trimming of the patterned mask is performed using a isotropic etch or a dry plasma etch process.

5. The method of claim 1 wherein said patterned mask comprises a nitrogen-containing layer overlying a silicon oxide layer.

6. The method of claim 5 wherein the nitrogen-containing layer comprises silicon oxynitride.

7. The method of claim 5 wherein the nitrogen-containing layer is removed prior to the annealing.

8. The method of claim 1, wherein the annealing occurs in an ambient comprising a gas selected from a group consisting essentially of hydrogen, nitrogen, argon, an inert gas, and combinations thereof.

9. The method of claim 8 wherein the annealing ambient is hydrogen gas at a pressure ranging from about $1.0 \times 10^{-9}$ torr to about 800 torr.

10. The method of claim 8, wherein the annealing ambient is nitrogen gas at a pressure ranging from about $1.0 \times 10^{-9}$ torr to about 800 torr.

11. The method of claim 1, wherein the annealing occurs in a reaction chamber having an evacuated environment.

12. The method of claim 1, wherein the annealing is performed in a vacuum environment at a pressure ranging from about $1.0 \times 10^{-10}$ torr to about $1.0 \times 10^{-3}$ torr.

13. The method of claim 1, wherein the annealing occurs in a reaction chamber having a temperature ranging from about 600 degrees Celsius to about 1200 degrees Celsius therein.

14. The method of claim 1, wherein the annealing occurs at an anneal time ranging from about 1 second to about 2 hours.

15. The method of claim 1, wherein the annealing is performed in a hydrogen gas environment at about 950 degrees Celsius for about one minute.

16. The method of claim 1, further comprising:

forming a gate dielectric material on a surface of the rounded channel region;

forming a gate electrode material on the gate dielectric material; and patterning the gate electrode material to form a gate electrode.

17. The method of claim 1, further comprising:

doping exposed portions of the semiconductor layer.

18. A method of manufacturing a semiconductor nanowire device, the method comprising:

forming a patterned mask on a semiconductor layer, said semiconductor layer overlying an insulator layer;

patterning said semiconductor layer to form a source region, a channel region, and a drain region in the semiconductor layer, wherein the channel region extends between the source region and the drain region;

recessing at least a portion of said patterned mask away from an edge of said semiconductor layer such that said semiconductor layer extends beyond each edge of said patterned mask;

rounding corners of the channel region by annealing the channel region; and forming a gate stack comprising a gate electrode overlying a gate dielectric material on a surface of and about the rounded channel region.

19. The method of claim 2, further comprising a step, after the step of patterning the semiconductor layer, of trimming the patterned mask.

20. A method of manufacturing a semiconductor device, the method comprising the steps of:

providing a semiconductor structure comprising a semiconductor layer overlying an insulating material;

forming a patterned mask over said semiconductor layer;

patterning the semiconductor layer to form a source region, a channel region, and a drain region in the semiconductor layer, wherein the channel region extends between the source region and the drain region;

rounding corners of the channel region by annealing, wherein the annealing is performed in a vacuum environment at a pressure ranging from about $1.0 \times 10^{-10}$ torr to about $1.0 \times 10^{-3}$ torr; and removing said patterned mask after said rounding step.

21. A method of manufacturing a semiconductor device, the method comprising the steps of:

providing a semiconductor structure comprising a semiconductor layer overlying an insulating material;

forming a patterned mask over said semiconductor layer;

patterning the semiconductor layer to form a source region, a channel region, and a drain region in the semiconductor layer, wherein the channel region extends between the source region and the drain region;

rounding corners of the channel region by annealing, wherein the annealing is performed in a hydrogen gas environment at about 950 degrees Celsius for about one minute; and removing said patterned mask after said rounding step.

* * * * *